United States Patent
Yajima et al.

(10) Patent No.: US 10,449,653 B2
(45) Date of Patent: Oct. 22, 2019

(54) HOLDING PAD

(71) Applicant: MARUISHI SANGYO CO., LTD., Tokyo (JP)

(72) Inventors: Toshiyasu Yajima, Tokyo (JP); Daisuke Ninomiya, Tokyo (JP)

(73) Assignee: MARUISHI SANGYO CO. LTD., Tokyo (JP)

(*) Notice: Subject to any disclaimer, the term of this patent is extended or adjusted under 35 U.S.C. 154(b) by 0 days.

(21) Appl. No.: 15/504,122

(22) PCT Filed: Nov. 26, 2014

(86) PCT No.: PCT/JP2014/081204
§ 371 (c)(1),
(2) Date: Feb. 15, 2017

(87) PCT Pub. No.: WO2016/038752
PCT Pub. Date: Mar. 17, 2016

(65) Prior Publication Data
US 2017/0259397 A1    Sep. 14, 2017

(30) Foreign Application Priority Data
Sep. 10, 2014  (JP) .................. 2014-184084

(51) Int. Cl.
*B24B 37/00*  (2012.01)
*B24B 37/30*  (2012.01)
*H01L 21/687*  (2006.01)

(52) U.S. Cl.
CPC ........ *B24B 37/30* (2013.01); *H01L 21/68757* (2013.01); *H01L 21/68771* (2013.01); *H01L 21/68785* (2013.01)

(58) Field of Classification Search
CPC ......... B24B 37/27; B24B 37/30; B24B 37/32; H01L 21/68714–68792
USPC .................... 451/398, 287, 288, 289, 364
See application file for complete search history.

(56) References Cited

U.S. PATENT DOCUMENTS

| 6,666,752 B1* | 12/2003 | Yamamoto | B24B 37/30 451/41 |
| 6,733,367 B1* | 5/2004 | Nguyen | B24B 37/042 451/28 |
| 2009/0252949 A1* | 10/2009 | Feng | B24B 37/30 428/316.6 |
| 2011/0315318 A1* | 12/2011 | Kobayashi | H01J 37/32642 156/345.27 |

(Continued)

FOREIGN PATENT DOCUMENTS

| JP | 2000212524 A | 8/2000 |
| JP | 2011000670 A | 1/2001 |

(Continued)

Primary Examiner — Robert A Rose
(74) Attorney, Agent, or Firm — Roberts & Roberts, LLP

(57) ABSTRACT

The present invention is a holding pad including a holding layer for holding a member to be polished, in which the holding layer includes on a part of a surface thereof a template fixing portion for sticking a template for preventing lateral displacement of the member to be polished, the template fixing portion has on a surface thereof an adsorption layer for adsorbing and fixing the template the template fixing portion, and the adsorption layer is formed of a composition which is formed by crosslinking a silicone composed of a predetermined siloxane.

13 Claims, 3 Drawing Sheets

(56) References Cited

U.S. PATENT DOCUMENTS

| | | | | |
|---|---|---|---|---|
| 2013/0186575 A1* | 7/2013 | Fujita | ............... | B32B 43/006 |
| | | | | 156/718 |
| 2013/0237040 A1* | 9/2013 | Kakuta | ............... | B32B 7/06 |
| | | | | 438/479 |

FOREIGN PATENT DOCUMENTS

| JP | 2002059362 A | 2/2002 |
|---|---|---|
| JP | 2004200451 A | 7/2004 |
| JP | 2007069295 A | 3/2007 |
| JP | 2014108485 A | 6/2014 |

* cited by examiner

HOLDING PAD

TECHNICAL FIELD

The present invention relates to a holding pad for holding and fixing a member to be polished, in a step of polishing the member to be polished, such as a wafer and glass, used in a semiconductor, an electronic component and the like.

BACKGROUND ART

In the manufacturing process of semiconductor components and electronic components such as a semiconductor wafer, a display glass substrate and a hard disc substrate, a polishing step is included for flattening and mirror finishing of the surfaces. The polishing step includes, in general, holding a member to be polished (hereinafter may be referred to as "work") to the polishing head of a polishing device, fixing a polishing pad to a surface plate, and relatively sliding the member to be polished and the polishing pad in a pressurized state while supplying a polishing slurry.

In the polishing step, the most general means for holding and fixing the work to the polishing head is a fixing method using a holding pad. The holding pad is a sheet which has, on a joint surface to the work, a holding layer that is composed of a soft material having micropores in the surface of a polyurethane foam or the like. A method of using the holding pad includes having water enter between the holding pad and the work during a polishing operation, and having water enter the micropores in the surface of the holding layer to adsorb and fix the work with its surface tension.

Incidentally, at the time of the polishing operation using the holding pad, the operation is often performed while a form material for preventing lateral displacement of the work is joined and fixed to the holding pad. This form material, although some form materials having names such as a template and a retainer ring are known, includes a plate material having a hole similar to the shape of the work (hereinafter, for convenience, in the present invention, this form material is referred to as a template). Insertion of the work into the frame of the template constrains the work in a lateral direction, and thus prevents displacement of the work during the polishing operation.

Since as described above, the template is fixed to the holding pad in order to constrain the work in the lateral direction, if the template is easily separated, it does not work properly. Hence, in the manufacturing of the holding pad with the template, various improvements have been made, and for example, as in PTL 1, a primary layer is interposed between the template and an adhesive for bonding it, and thus the joint strength of the template is acquired.

CITATION LIST

Patent Literature

PTL 1: Japanese Patent Laid-Open Publication No. 2007-069295

SUMMARY OF INVENTION

Technical Problem

In the conventional holding pad with the template manufactured as described above, the template is firmly joined, and thus the template cannot be arbitrarily attached and removed. This is not desirable with consideration given to the cost of the polishing operation. Since the template needs to be selected according to the shape and size of the work, a plurality of holding pads needs to be prepared for the individual pieces of work. In this way, the cost for acquiring and storing them is increased.

Further, since the conventional holding pad with the template is practically a disposable, it is desirable to be used for as long time as possible. In this point, the template and the holding pad themselves do not become worn and abraded by the polishing operation. However, along with long-term usage, abrasive grains enter a joint interface between the surface of the holding layer and the template, and then this causes a polishing burn and a scratch. Hence, regardless of the presence of wear, it is difficult to use them for a long period of time.

Hence, the present invention provides a holding pad which can cope with a polishing operation using a template flexibly and at a low cost.

Solution to Problem

The present inventors examine, as a holding pad which can solve the problem described above, the development of a holding pad in which a template is removable. The removable template allows any template corresponding to the shape and dimensions of a work to be polished to be used, which also enables an efficient operation. Moreover, such a removable template makes it possible to perform the polishing operation while cleaning the abrasive grains having entered the joint interface between the surface of the holding layer and the template, which enables long-term and stable usage of the polishing pad while preventing a polishing burn and a scratch.

On the other hand, when the template is made removable, it will be made an issue what joint method is used for the template. A transverse stress to which the work is subjected during the polishing operation is by no means low, and thus the template for preventing displacement caused by a lateral stress needs to be suitably and firmly joined to the holding pad. However, when the template is excessively firmly joined, it is impossible to achieve the object to make the template removable.

The present inventors examined a method of joining the template to the holding pad in a removable state. Consequently, they conceive the present invention of applying an adsorption layer composed of a predetermined silicone to an attachment portion of the template.

Specifically, the present invention is a holding pad including a holding layer for holding a member to be polished, wherein the holding layer includes, on part of a surface of the holding layer, a template fixing portion for sticking a template for preventing lateral displacement of the member to be polished, the template fixing portion has an adsorption layer for adsorbing and fixing the template on a surface of the template fixing portion, and the adsorption layer is composed of a composition which is formed by crosslinking at least one type of silicone selected from a silicone composed of a linear polyorganosiloxane having a vinyl group only at both ends, a silicone composed of a linear polyorganosiloxane having a vinyl group at both ends and a side chain, a silicone composed of a branched polyorganosiloxane having a vinyl group only at an end and a silicone composed of a branched polyorganosiloxane having a vinyl group at an end and a side chain.

As described above, the present invention is the holding pad in which in order to fix the template, the adsorption layer formed of an adsorption material made of a specific silicone is formed on the holding layer. The individual configurations of the holding pad according to the present invention will be described in detail below.

Firstly, the holding pad having the holding layer which is the basis for the present invention is basically the same as the conventional holding pad. The holding layer constituting the surface layer of the holding pad on the work side is composed of a soft resin material having micropores in the surface, water is made to enter the micropores and thus it is possible to adsorb and fix the work with surface tension. As the constituent material of the holding layer, a foamed plastic foam formed of a polymer such as polyurethane, polyamide or polyimide is preferably used. Further, the holding layer is stuck, as necessary, with a base material sheet which is formed by singly using a non-woven fabric, an organic resin material or the like or by combining them, and thus it is possible to form the holding pad. Furthermore, on the outermost layer on the back side (the opposite side of the holding layer) of the holding pad, an adhesive may be applied appropriately so as to fix a surface plate.

The set position and the shape of the template fixing portion formed on the holding layer are determined by the template which is assumed to be used. The template has an outer shape and an opening shape into which the work is inserted, and the shape of the template fixing portion is determined by them. In addition to only one type of template which is assumed to be used, the present invention can correspond to the use of a plurality of types of templates. In other words, the shape of the template fixing portion may be set substantially equal to the shape of one template or may be set to a shape which can include the shapes of a plurality of templates. For example, when as shown in FIG. 1(a), only one ring-shaped template (which is often referred to as a retainer ring) is applied to a disc-shaped holding pad, a region whose shape and dimensions are substantially equal to those of the ring-shaped template may be set to be the template fixing portion. Further, in order to correspond to ring-shaped templates having different dimensions as shown in FIG. 1(b), a region which includes the respective shapes of the templates can also be set to the template fixing portion. Moreover, it is also possible to correspond to a plurality of templates having different dimensions and shapes as shown in FIG. 1(c).

The shape of the opening of the template (the shape of the template fixing portion corresponding to this) is not particularly limited. In addition to the shape of the ring-shaped template fixing portion corresponding to a single piece of work as shown in FIG. 1(a) described above, it may be also possible to adopt the shape corresponding to a template having a plurality of circular openings for fixing a plurality of pieces of work as shown in FIG. 2.

The adsorption layer is joined to the surface of the template fixing portion. The adsorption material constituting the adsorption layer is formed by stacking, in layers, a composition which is formed by crosslinking at least one type of silicone selected from a silicone composed of a linear polyorganosiloxane having a vinyl group only at both ends, a silicone composed of a linear polyorganosiloxane having a vinyl group at both ends and a side chain, a silicone composed of a branched polyorganosiloxane having a vinyl group only at an end, and a silicone composed of a branched polyorganosiloxane having a vinyl group at an end and a side chain.

The silicone described above has an adsorption action regardless of a material such as glass or metal and has a satisfactory holding force. The holding force has characteristics in which in particular, a shear force (a fixing strength in a lateral direction) is high whereas a separation force (a fixing strength in a longitudinal direction) is low. Hence, it is possible to hold the work also with respect to a stress in the lateral direction caused by the polishing operation without lateral displacement of the template. Further, the adsorption force of the adsorption layer is uniform within the surface, a partial separation and a gap are hard to be produced and a polishing slurry is prevented from entering between the holding pad and the template.

Then, the template is easily fixed, attached and removed due to the relationship between the shear force and the separation force described above. In other words, when the template is fixed, attached and removed, the template is pressed to the pad in a vertical direction and thus can be fixed, and the template is only pulled in the vertical direction and thus can be separated. Note that the adsorption layer has a low separation force, it refers to a force on the basis of the shear force, and the separation force is not so weak as to have the template come off or leave a gap during the polishing operation.

As a specific example of the silicone constituting the adsorption layer, the compound of Chemical Formula 1 is taken as an example of the linear polyorganosiloxane. Further, the compound of Chemical Formula 2 is taken as an example of the branched polyorganosiloxane.

[Chemical Formula 1]

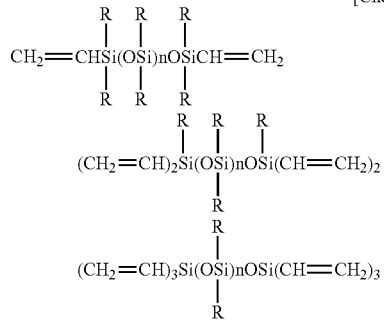

(In the formula, R represents a substituent group, and n represents an integer)

[Chemical Formula 2]

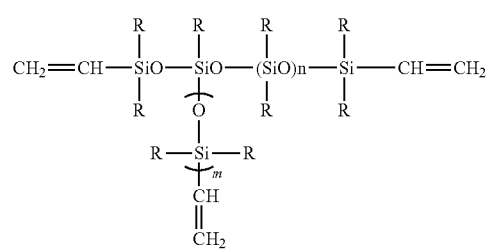

(In the formula, R represents a substituent group, and m and n each represent an integer)

The specific examples of the substituent group (R) in Chemical Formulas 1 and 2 include alkyl groups such as a methyl group, an ethyl group and a propyl group, aryl groups such as a phenyl group and a tolyl group and a monovalent hydrocarbon group except a homologous or heterologous and unsubstituted or substituted aliphatic unsaturated group in which a halogen atom, a cyano group and the like substitute for part or the whole of hydrogen atoms bonded to the carbon atoms of the groups described above. At least 50 mole % or more are preferably methyl groups. The substituent group may be homologous or heterologous. The polysiloxane may be formed singly or formed with a mixture of two types or more.

Further, the silicone constituting the adsorption layer and having a number average molecular weight of 30000 to 100000 has a preferable adsorption action. However, the number average molecular weight of the silicone applied and a firing temperature in the stage of manufacturing have an influence on the adjustment of the surface roughness. In order to easily exhibit the suitable surface roughness, the number average molecular weight of the silicone is preferably 30000 to 60000.

In the holding pad according to the present invention, the template fixing portion is formed with the adsorption layer composed of the silicone material described above. The thickness of the adsorption layer is preferably 20 to 50 μm.

When the template fixing portion having the adsorption layer is formed, it is sufficient to join the adsorption layer which has been previously formed in the intended shape onto the holding layer of the holding pad. In joining the silicone material of the adsorption layer may be directly joined to the holding layer, however it is preferable to stack a support layer for supporting the adsorption layer below the adsorption layer (on the holding pad side), and join to the holding layer via the support layer.

This support layer is intended to enhance close contact between the adsorption layer and the holding layer. Since the silicone material forming the adsorption layer is a thin soft material, it is difficult to secure close contact with the holding layer. Hence, so far as a somewhat hard support layer is disposed between both layers, it is possible to secure close contact. Further, by setting a support layer having moderate hardness at this time, it is possible to absorb the lateral displacement of the work caused by minute vibration during the polishing operation.

The support layer of the adsorption layer is preferably composed of an organic resin material which has appropriate hardness and flexure and whose tensile elastic modulus is 2600 to 4200 MPa (measurement value at the time of drying). Specific examples include resins such as polyester, polyethylene, polystyrene, polypropylene, nylon, urethane, polyvinylidene chloride and polyvinyl chloride. The organic resin material is preferably a polyester-based resin material such as polyethylene terephthalate (PET) or polyethylene naphthalate (PEN), and is particularly preferably PET. Since PET has satisfactory strength and chemical resistance, PET can function as the constituent member of the holding pad without being broken and eroded even in the polishing operation repeated for a long period of time. Note that this buffer layer may be a single layer or may have a multilayer structure formed with a plurality of resins. The thickness of the support layer is preferably 20 to 200 μm.

The holding pad according to the present invention can be manufactured by preparation of the conventional holding pad and joining of the adsorption layer onto the surface of the holding layer. It is preferable to apply the adsorption layer to which the support layer is previously joined. For formation of the adsorption layer on the support layer, applying a coating solution which contains a silicone component serving as the raw material of the adsorption layer to the support layer and burning it allow the polyorganosiloxane to be crosslinked to form the adsorption layer. The coating solution contains the linear or branched polyorganosiloxane compound and a crosslinking agent. As the crosslinking agent, a known one will do, including organohydrogenpolysiloxane, for example. Although one molecule of organohydrogenpolysiloxane has at least three hydrogen atoms bonded to a silicon atom, it is preferable in terms of practical use, that organohydrogenpolysiloxane having two ≡SiH bonds in the molecule is up to 50 weight % of the total amount, and organohydrogenpolysiloxane having at least three ≡SiH bonds in the molecule is the remaining.

The coating solution may contain a platinum-based catalyst which is used in the crosslinking reaction. Applicable as the platinum-based catalyst will be a known one including chloroplatinic acids such as first chloroplatinic acid and second chloroplatinic acid, the alcohol compound and the aldehyde compound of a chloroplatinic acid and salts of a chloroplatinic acid and various types of olefin. Further, the coating solution may have any form of a solvent-free type, a solvent type or an emulsion type. When the solvent-type coating solution is used, it is preferable to subject the solution to drying after the application of the coating solution to remove the solvent. The burning after the application of the coating solution is preferably heating at 120 to 180° C. for 60 to 150 seconds.

The dimensions of the holding pad according to the present invention are not particularly limited. The holding pad whose shape and dimensions are substantially the same as those of the work may be used or the holding pad whose diameter is larger than that of the work may be used.

Moreover, the present invention assumes use of a template, however the template is not integrally joined to the holding pad. In the present invention, an appropriate template can be used according to the shape and dimensions of the work. As the template itself, a template equivalent to the conventional one can be used. The template is a form material which has an opening similar to the shape of the work, and the material of the template is formed of a resin, for example, an organic resin material such as glass epoxy, PEEK, polyimide, Bakelite, polyvinyl chloride or ABS or is formed of a metal such as stainless steel and the template is a thin plate whose thickness is 20 μm to 10 mm. In the use of the holding pad according to the present invention, the template can be repeatedly used, and even when the holding pad is replaced, the template can be used again. Note that, as already described, the form material having an opening for preventing lateral displacement of the work is collectively referred to as the "template" in the present invention. Although the form material may be referred to as several names such as a retainer ring, form materials having different names are also concepts which are included in the "template" of the present invention.

Advantageous Effects of Invention

The holding pad according to the present invention allows a template which has been conventionally bonded and fixed to become removable. According to the present invention, it is possible to bring the template into a suitable state while removing and attaching the template appropriately, and to suppress the occurrence of a polishing burn and a scratch in the work. When the holding pad is replaced, the template can be used again, which is economical.

DESCRIPTION OF EMBODIMENTS

Figure 1:
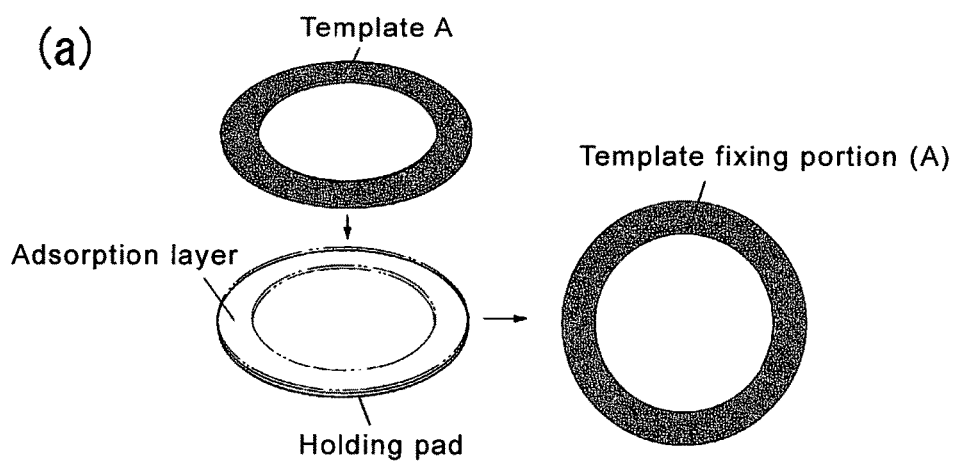
FIG. 1 is a diagram illustrating the form of a template fixing portion in a holding pad according to the present invention.
Figure 1:
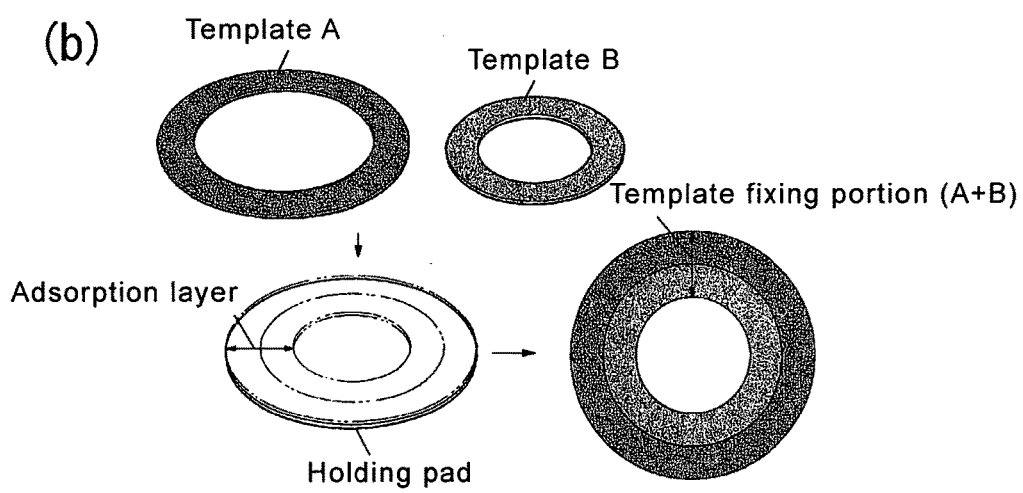
Figure 1:
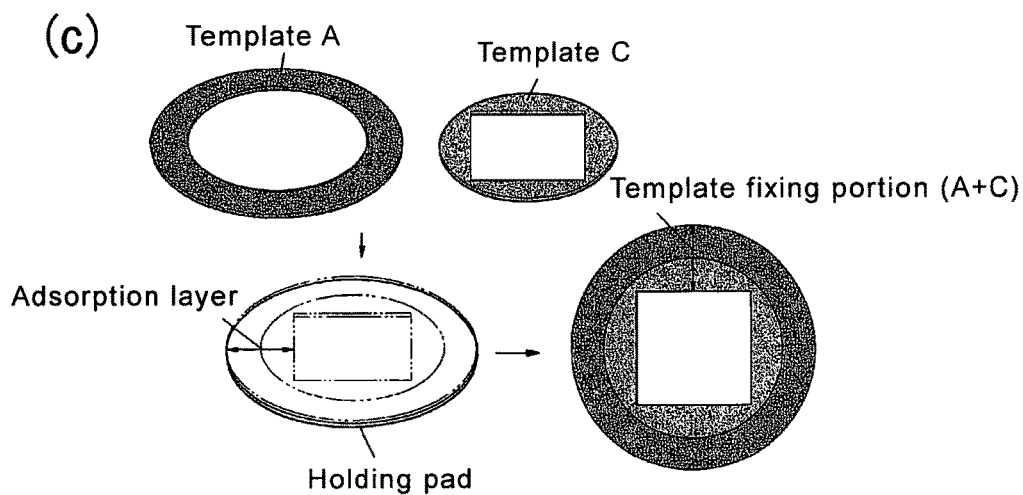
Figure 2:
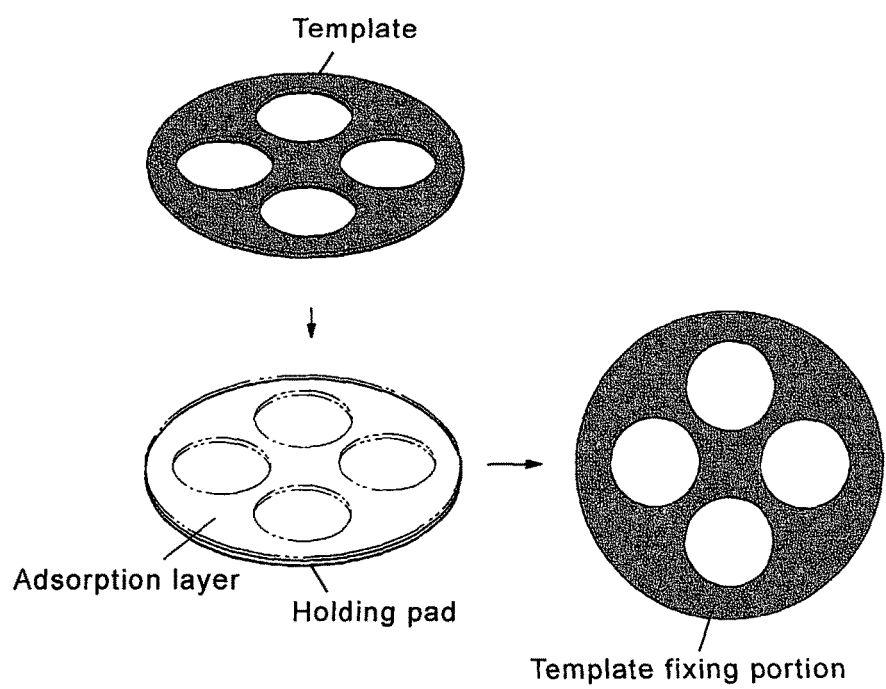
FIG. 2 is a diagram illustrating the form of the template fixing portion and others in the holding pad according to the present invention.
Figure 3:
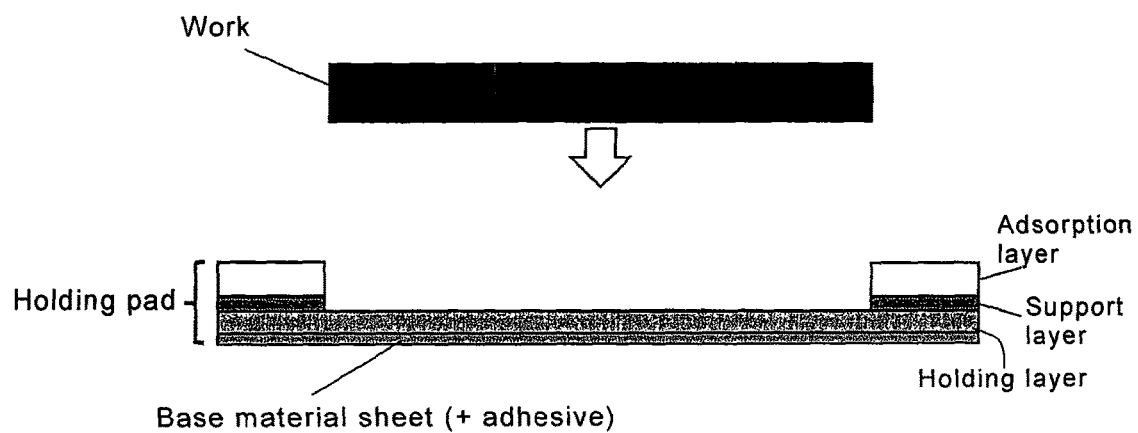
FIG. 3 is a cross-sectional diagram of a holding pad manufactured in the present embodiment.

A preferred embodiment of the present invention will be described below. In the present embodiment, a holding pad was manufactured which has the same ring-shaped template fixing portion as shown in FIG. 1(a). FIG. 3 is a diagram schematically illustrating a cross-sectional structure of the holding pad.

In the manufacturing process of the holding pad, an adsorption layer was joined to an arbitrary region serving as the template fixing portion of the holding pad, and thus the holding pad was manufactured. Then, it was evaluated whether or not there is an influence on work holding performance and polishing characteristics. The manufacturing process of the holding pad is as follows.

The holding pad is a circular sheet (dimensions: diameter of 355 mm, thickness of 0.8 mm) whose material is a polyurethane foam serving as a holding layer, and a base material sheet (made of PET) coated with an adhesive is stuck to the back surface of the holding pad. The surface of the adhesive is protected by a separation film, and when the holding pad is used, the separation film is peeled, and thus the holding pad can be fixed to a polishing head. The template used in the present embodiment is a ring-shaped template in which the outer diameter is 355 mm equal to the holding pad and the inner diameter is 301.5 mm. In the present embodiment, a ring-shaped band region having the same width (26.75 mm) as the template along the outer circumference of the holding pad was set as the template fixing portion.

Then, the adsorption layer to be joined to the template fixing portion was manufactured. As the organic resin material serving as a support layer, a PET sheet (thickness of 50 μm, dimensions of 500 mm×500 mm) was prepared. The tensile elastic modulus of the PET sheet was 2800 MPa as a result of previous measurement. Then, applied to the PET sheet was a coating solution containing a silicone component composed of polyorganosiloxane that is a precursor of the adsorption layer. The coating solution is a solvent-free type silicone solution which contains 0.6 weight parts of a crosslinking agent and 2 weight parts of a platinum catalyst in 100 weight parts of a silicone (having a molecular weight of 30000) composed of a linear polyorganosiloxane having a vinyl group only at both ends. After the coating solution was applied to the organic resin material, the resin was subjected to burning at 150° C. for 100 seconds to crosslink the silicone and thus the adsorption layer was formed. The thickness of the adsorption layer after the crosslinking is 28 μm. After the formation of the adsorption layer, the sheet is released from a mold, and thus a ring-shaped plate material is obtained.

Then, the adsorption layer manufactured as described above was joined to the holding pad. The adsorption layer was joined through the steps of: applying an acrylic-based adhesive to the rear surface of the support layer, compressing the support layer with a load of 0.75 kgf/cm$^2$; and press holding for an hour to join the support layer of the adsorption layer onto the holding pad.

Figure 4:
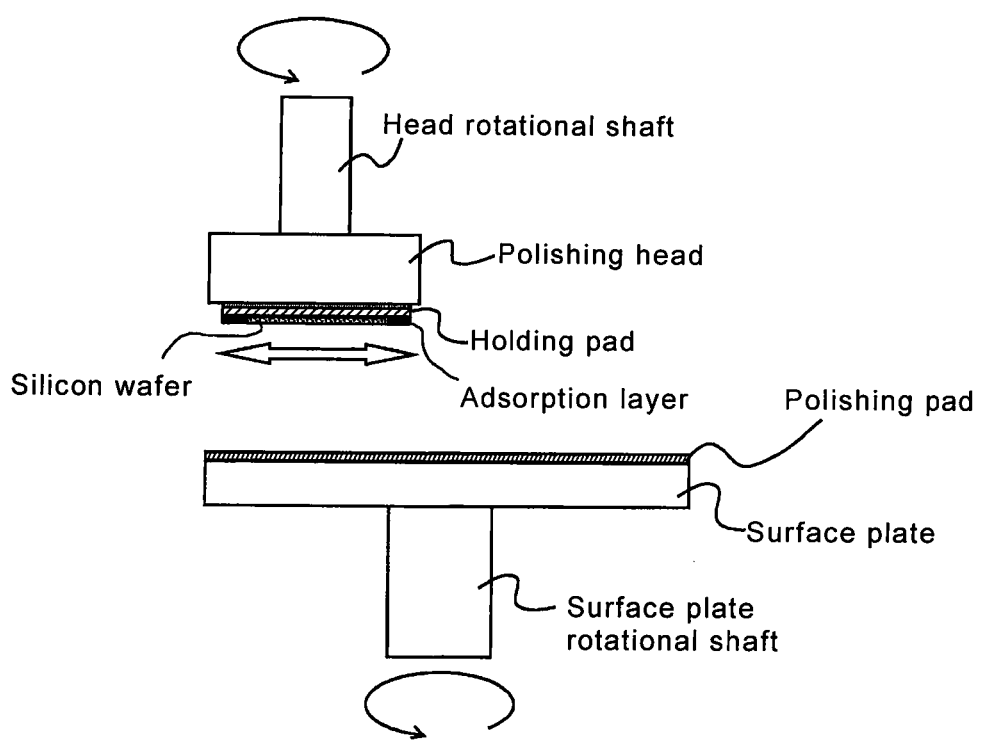
FIG. 4 is a schematic of a polishing device used in the present embodiment.

A polishing test using the holding pad manufactured in the present embodiment was performed. In this polishing test, the holding pad was stuck with an adhesive tape to the polishing head of the polishing device shown in FIG. 4, and thereafter the template was adsorbed and fixed to a template holding portion while the template was being positioned to the template holding portion. Then, a silicon wafer which is a member to be polished was fixed to the opening of the template.

Then, the polishing pad was stuck to a surface plate, and a polishing operation was performed while a polishing slurry (where Glanzox (made by Fujimi Incorporated.) was diluted 30-fold with pure water) was being dripped (at a flow rate of 150 ml/min) to a polishing layer. The other polishing conditions were as follows.

Polishing pressure: 0.163 kgf/cm$^2$
Rotational speed of the polishing pad: 45 rpm
Rotational speed of the member to be polished: 47 rpm
Swing rate of the head: 250 mm/min
Polishing period: 3 min After the polishing operation, a wafer fixing position on the holding pad was checked, whether or not a displacement occurred was checked and the holding performance of the holding pad was checked. Consequently, the wafer fixing position was not changed, and it was confirmed that the wafer was properly held with the holding pad. Further, it was also found that the template was not displaced.

After the polishing test, the polished surface of the wafer was washed with pure water, and was dried in a dust-free state. Then, when the state of the polishing surface was checked and it was observed whether or not abrasive grains adhered to an end portion, the occurrence of a scratch was not found, and a polishing burn was also not found at the end portion.

Moreover, after the polishing test, the template was pulled in the vertical direction to be easily peeled, and thus it was possible to clean the holding layer of the holding pad. Then, after the cleaning, it was possible to adsorb and fix the template again. The holding pad according to the present invention is characterized by the ease of attachment and removal of the template. The attachment and removal and the cleaning of the template made it possible to use the holding pad for a long period of time as compared with the conventional one.

INDUSTRIAL APPLICABILITY

The present invention applies the holding pad in which the template is made removable, which has not been so far conceived, thus achieving the satisfactory operability of fixing and removal and attachment of the work. Further, the polishing properties are not affected. According to the present invention, it is possible to efficiently perform the polishing operation, and to reduce the manufacturing cost of a semiconductor component and the like.

The invention claimed is:

1. A holding pad comprising:
    (i) a base material sheet;
    (ii) a holding layer, to which the base material sheet is stuck, for holding a member to be polished, wherein the holding layer includes on part of a surface thereof a template fixing portion for sticking a template for preventing lateral displacement of the member to be polished; and (iii) an adsorption layer for adsorbing and fixing the template, said adsorption layer being present on a surface of the template fixing portion of the holding layer;

wherein the template consists of a plate material having a hole, which hole is similar in shape to the member to be polished, and the holding layer is composed of a foamed plastic foam having micropores on its surface, and the adsorption layer consists of a composition which is formed by crosslinking at least one type of silicone selected from a silicone composed of a linear polyorganosiloxane having a vinyl group only at both ends, a silicone composed of a linear polyorganosiloxane having a vinyl group at both ends and a side chain, a silicone composed of a branched polyorganosiloxane having a vinyl group only at an end and a silicone composed of a branched polyorganosiloxane having a vinyl group at an end and a side chain.

2. The holding pad according to claim 1, wherein the adsorption layer is bonded onto the holding layer.

3. The holding pad according to claim 1, wherein a thickness of the adsorption layer is 20 to 50 μm.

4. The holding pad according to claim 1, wherein the adsorption layer is bonded to the holding layer via a support layer, and the support layer is composed of an organic resin material which has a tensile elastic modulus of 2600 to 4200 MPa.

5. The holding pad according to claim 4, wherein the organic resin material constituting the support layer is either polyethylene terephthalate or polyethylene naphthalate.

6. The holding pad according to claim 2, wherein a thickness of the adsorption layer is 20 to 50 μm.

7. The holding pad according to claim 2, wherein the adsorption layer is bonded to the holding layer via a support layer, and the support layer is composed of an organic resin material which has a tensile elastic modulus of 2600 to 4200 MPa.

8. The holding pad according to claim 3, wherein the adsorption layer is bonded to the holding layer via a support layer, and the support layer is composed of an organic resin material which has a tensile elastic modulus of 2600 to 4200 MPa.

9. The holding pad according to claim 6, wherein the adsorption layer is bonded to the holding layer via a support layer, and the support layer is composed of an organic resin material which has a tensile elastic modulus of 2600 to 4200 MPa.

10. The holding pad according to claim 7, wherein the organic resin material constituting the support layer is either polyethylene terephthalate or polyethylene naphthalate.

11. The holding pad according to claim 8, wherein the organic resin material constituting the support layer is either polyethylene terephthalate or polyethylene naphthalate.

12. The holding pad according to claim 9, wherein the organic resin material constituting the support layer is either polyethylene terephthalate or polyethylene naphthalate.

13. The holding pad according to claim 1, further comprising a support layer composed of an organic resin material, which support layer is present between the adsorption layer and the holding layer.

* * * * *